United States Patent [19]

Lewis et al.

[11] Patent Number: 4,954,428

[45] Date of Patent: Sep. 4, 1990

[54] COATING FOR INCREASING SENSITIVITY OF A RADIATION IMAGEABLE POLYACETYLENIC FILM

[75] Inventors: David F. Lewis, Monroe, Conn.; Robert D. Schenfele, Caldwell, N.J.

[73] Assignee: GAF Chemicals Corporation, Wayne, N.J.

[21] Appl. No.: 401,717

[22] Filed: Sep. 1, 1989

Related U.S. Application Data

[62] Division of Ser. No. 258,522, Oct. 17, 1988.

[51] Int. Cl.$^5$ .......................... G03C 1/72; G03C 1/78
[52] U.S. Cl. ..................................... 430/495; 430/271; 430/275; 430/296; 430/935; 430/944; 430/945
[58] Field of Search ............... 430/296, 495, 945, 271, 430/275, 935, 944

[56] References Cited

U.S. PATENT DOCUMENTS

| | | | |
|---|---|---|---|
| 1,897,843 | 2/1933 | Hickman et al. | 430/495 |
| 3,772,027 | 11/1973 | Luckey et al. | 430/495 |
| 3,822,134 | 6/1974 | Rasch et al. | 430/935 |
| 4,734,355 | 3/1988 | Lewis et al. | 430/296 |

*Primary Examiner*—Paul R. Michl
*Assistant Examiner*—Thorl Chea
*Attorney, Agent, or Firm*—Marilyn J. Maue; Joshua J. Ward

[57] ABSTRACT

The invention relates to an aqueous coating composition containing a N-alkyl lactam dispersing aid and a water soluble metal salt having an atomic number greater than 50 dispersed in between about 4 and about 50 wt. % of an aqueous binder solution compatible with a binder employed for crystalline polyacetylenic crystals used in an imaging process.

17 Claims, No Drawings

COATING FOR INCREASING SENSITIVITY OF A RADIATION IMAGEABLE POLYACETYLENIC FILM

This is a division of application Ser. No. 258,522, filed Oct. 17, 1988, pending.

In one aspect the invention relates to a sensitizing composition for polyacetylenic compounds responsive to radiant energy development.

In another aspect the invention relates to the preparation of said sensitizing compositions in a form useful for coating the emulsion surface of a radiant energy sensitive film and in still another aspect the invention pertains to the use of the present sensitizing compositions.

BACKGROUND OF THE INVENTION

Much research is devoted to increasing the sensitivity of films subject to imaging by radiant energy exposure. The aim of such research is to increase the sensitivity of relatively unresponsive compounds, particularly polyacetylenic compounds of low imaging potential, to improve color intensity of the developed image, to heighten response of certain commpounds to meet the needs of a particular form of radiant energy exposure and to further improve the sensitivity of highly sensitive polyacetylenic compounds.

Accordingly, it is an object of this invention to provide a sensitizing coating composition capable of providing the above advantages.

Another object of the invention is to provide a layer of highly sensitive polyacetylenic material by coating said layer with the present sensitizing agent in a a formulation.

Still another object is to provide an economical and commercially feasible process for the preparation of compositions containing the present sensitizing agents.

These and other objects of the invention will become apparent from the following description and disclosure.

THE INVENTION

In accordance with this invention there is provided a coating composition for an irradiation sensitive polyacetylenic film layer which composition comprises between about 0.001% and about 1% by weight of an N-alkyl lactam dispersing aid and a water soluble metal salt of a metal having an atomic number of at least 50, preferably at least 78, dissolved in from about 4% to about 50 wt. % of an aqueous solution of a binder compatible with a binder employed for fixing crystals of said polyacetylene in an imageable film layer, to provide an aqueous coating dispersion having between about 1% and about 60% by weight of solids.

The preferred aqueous coating compositions of this invention employ water soluble salts of metals having relatively high atomic mass and high energy capture cross section, e.g. platinum, bismuth, lead and thallium salts such as the nitrate, acetate, persulfate and perchlorate salts, of which the lead salts are most preferred. Also preferred of the present coating compositions are those which contain from about 0.5% to about 1% by weight lactam, from about 20% to about 55% by weight metal salt and from about 25% and about 50% by weight of an aqueous binder solution to provide an aqueous composition containing between about 5% and about 30% by weight total solids.

In the above coating composition, the weight ratio of lead salt to dispersing aid can vary between about 200:1 and about 10:1, but is preferably employed at a ratio of from about 60:1 to about 20:1 and the weight ratio of lead salt to binder is employed within the range of from about 0.4:1 to about 2.5:1, preferably from about 0.8:1 to about 1.5:1. Generally, the concentration of metal salt with respect to water in the coating composition is between about 1% and about 75% by weight, preferably between about 20 and about 55% by weight.

Suitable binders for the coating composition include natural and synthetic plastics, resins, waxes, colloids, gels and the like including gelatins, desirably photographic-grade gelatin, various polysaccharides including dextran, dextrin, hydrophilic cellulose ethers and esters, acetylated starches, natural and synthetic waxes including paraffin, beeswax, polyvinyl-lactams, polymers of acrylic and methacrylic esters and amides, hydrolyzed interpolymers of vinyl acetate and unsaturated addition polymerizable compounds such as maleic anhydride, acrylic and methylacrylic esters and styrene, vinyl acetate polymers and copolymers and their derivatives including completely and partially hydrolyzed products thereof, polyvinyl acetate, polyvinyl alcohol, polyethylene oxide polymers, polyvinylpyrrolidone, polyvinyl acetals including polyvinyl acetaldehyde acetal, polyvinyl butyraldehyde acetal, polyvinyl sodium-o-sulfobenzaldehyde acetal, polyvinyl formaldehyde acetal, and numerous other known photographic binder materials capable of forming a dope, solution, dispersion, gel or the like. Of the above binders, gelatin is preferred.

The N-alkyl lactam dispersing aid suitably employed in this invention includes N-alkyl-pyrrolidones wherein the alkyl group contains from 10 to 22 carbon atoms. These may include pyrrolidones having lower alkyl substitution on the ring carbon atoms which possess dispersion properties. Preferred of this group are the $N-C_{10}$ to $C_{14}$-alkyl pyrrolidones and most preferred is N-dodecyl-2-pyrrolidone.

The present coating compositions are prepared by forming an aqueous binder solution by mixing the binder component, such as gelatin, with from about 1 to about 30, preferably from about 4 to about 15, volumes of water for a period of from about 30 to about 60 minutes at a temperature of between about 25° C. and about 80° C. at about 1 to about 20 atmospheres pressure. To this aqueous binder solution is added, over a period of from about 5 to 60 minutes, a solution of lead salt and dispersion aid in from about 10% to 60% by weight, preferably in 20% to 50% by weight, of water. The addition is accompanied by agitation at similar temperature conditions to provide uniformity in the resulting dispersion. Usually an acceptable dispersion is achieved after stirring for 10 to 30 minutes. The resulting composition can be then rapidly solidified by refrigeration at between about 0° C. and about 15° C. and stored for future use. Alternatively, refrigeration can be omitted when the mixture is coated directly on the emulsion surface of a polyacetylenic film layer.

The film coating conditions include a coating speed of from about 1 ft/min to about 10,000 ft/min at a temperature of from about 20° C. to about 70° C., preferably 35° C. to about 65° C. in thicknesses ranging between about 0.25 to about 500 micrometers, to provide a polyacetylene/binder layer coated with between about 0.25 and about 500 micrometers, preferably between about 2 to about 40 micrometers, of the present composition as a discrete overcoat layer. In this respect the present invention is distinguished from other sensitizing systems where the imageable polyacetylene is in direct contact with sensitizing agents.

The coating composition herein described offers the advantage of obviating uncontrollable crystallization of metal salts and polyacetylene due to electrochemical precipitation or salting out. Such crystallization invariably results in poorer definition and resolution of the image transmitted to the film. Sensitizing the system with the present overcoating layer avoids this problem. Also, in the present system wherein the sensitizing salt forms a discrete layer over the imageable polyacetylene layer, unwanted crystallization is prevented when the sensitizing salt and imageable polyacetylene are combined. Accordingly, the same high quality resolution standard of the direct imaging is maintained.

It is theorized that the success of the present process is in part dependent on the ability of the salt layer to absorb energy. The metal salt layer, containing a significant proportion of high atomic number nuclei, is able to absorb and transfer radiant energy to the polyacetylene layer by a mechanism which sensitizes the film towards X-ray and gamma rays. It is known that polyacetylene are less sensitive to gamma rays and X-rays than to ultraviolet and electron beams radiation. However the salts in the present compositions, particularly the Pb, Bi and Tl salts, increase the sensitivity of polyacetylenic films towards X-rays and gamma rays without adversely affecting the ultraviolet and electron beam sensitivity and thus enables imaging of high definition and resolution from additional sources of radiation. More particularly, the coated polyacetylenic film possesses an increase in optical density units of from about 100 to about 2000%. For example, an increase of 2000% optical density units has been achieved with a lead nitrate coating on pentacosadiynoic acid.

Generally, the polyacetylenic film comprises the image receptive polyacetylenic layer overlaying a supported conductive layer, and in certain cases is more firmly affixed thereto by means of a thin adhesive layer having a thickness of between 1 and 1.5 micrometer. When used, suitable adhesives include acrylate based polymers and copolymers, particularly those containing carboxylate moieties such as acrylic acid or methacrylic acid residues and mixtures of these polymers or copolymers with gelatin.

In certain cases, when a conductive metal sheet is employed as the substrate, a separate conductive layer may be eliminated and the image-receptive layer disposed directly on the metal sheet conductive support.

The image receptive layer, which is the surface layer of the imaging film, comprises the polyacetylenic microcrystals dispersed in a binder material which can be any of the binders used for the coating composition and is most preferably gelatin. The polyacetylenic compounds of the present invention are normally crystalline at ambient temperature and are preferably conjugated diynes, most preferably hydrocarbon or acid diynes containing from 20 to 30 carbon atoms. A general formula for these preferred acetylenic compounds is represented by the structure $A-(CH_2)_n-C\equiv C-C\equiv C-(CH_2)_m-B$ wherein m and n are both independently an integer of from 6 to 14 and A and B are independently methyl or carboxyl groups. Specific examples of such polyacetylenes include pentacosa-10,12-diynoic acid; 13,15-octacosadiyne and docosa-10,12-diyne-1,22-dioic acid. Of these, the aged pentacosa-10,12-diynoic acid is most preferred since it provides unusually high sensitivity to electron beam exposure. It is to be understood however, that dispersions of other normally crystalline, color developing polyacetylenes having a conjugated structure can be employed alone or in admixture with the preferred diynes as the image receptive layer of the present invention. Such compounds include the diynes of the above structure wherein the A and/or B moieties, in addition to lower alkyl or carboxyl, also can be hydroxy, amido, lower alkyl substituted amido, an aliphatic or aromatic carboxylate ester group having up to 10 carbon atoms, a mono- or di- valent carboxylate metal salt group, halo, carbamyl, lower alkyl substituted carbamyl or tosyl, as well as the corresponding triyne and tetrayne products of the above polyacetylenes having from 20 to 60 carbon atoms and a conjugated structure. Examples of these compounds include 10,12-docosadiynediol, the ditoluene-p-sulfonate of 9,11-eicosadiynoic acid, the monoethyl ester of 10,12-docosadiynedioic acid, the sodium or potassium salt of 10,12-pentacosadiynoic acid, 10,12-docosadiyne chloride, 10,12-pentacosadiyne (m-tolyl-urethane), 10,12-pentacosadiyne {[(butoxylcarbonyl)-]methyl urethane}, N-(dimethyl)-10,12-pentacosadiynamide, N,N′-bis($\alpha$-methylbenzyl) 10,12-pentacosadiyndiamide, etc. The polyacetylenic compounds of this invention are employed in microcrystalline form and these crystals are dispersed in the non-solvating liquid binder preferably an aqueous solution of plastic, resin, colloid or gel and coated on a suitable conductive substrates to a layer thickness of from about 0.25 to about 500 micrometers. On drying, the crystals become fixedly positioned in the binder.

The polyacetylenic film is optionally chill set or it can be aged according to the process described in co-pending application Ser. No. 941,885, filed Dec. 15, 1986, (now U.S. Pat. No. 4,734,355), before applying the present coating composition.

The coated films of this invention are those suitable for imaging by radiant energy. The radiant energy contemplated as the energy source includes that generated from an electron beam such as developed by cathode ray guns, gamma rays and X-rays used in radiography, beta rays, electron corona discharge, ultra-violet and light, actinic radiation from visible and infra-red regions of the electromagnetic spectrum and other forms of corpuscular and/or wave-like energy generally deemed to be radiant energy. For radiographic and short wave UV exposure, the conductive layer in the above dielectric film may be eliminated and the image-receptive crystals in the binder may be disposed directly on the substrate material; although absence of the conductive layer may permit the film to become so charged that a beam of electrons or ions employed for imaging may be somewhat distorted.

The present aqueous coating compositions are applied as a discrete layer over a film surface by known techniques. For example the aqueous composition can be coated over an imageable film carrying a dry surface layer of polyacetylene crystals fixed in a binder. Alternatively, the aqueous coating solution can be applied over a wet layer of polyacetylene crystals in a binder having a density higher than that of the coating composition. Although the prior method prevents any diffusion of metal into the polyacetylene layer, only minimal amounts occur when employing the alternative method.

In the use of the coated film, the radiant energy that impinges upon the coated surface encounters the metal salt resulting in high absorption of photon energy and the transfer of radiant energy into the polyacetylenic layer, thus causing an increase in sensitivity of the polyacetylenic layer. The discrete layers of coating and imageable polyacetylene prevent metal diffusion and uncontrolled crystallization of metal salt and polyacetylene due to increased nucleation and electrochemical precipitation.

Having thus described the present invention, reference is had to the following examples which are intended to illustrate specific embodiments of the invention but which should not be construed as limiting to the scope thereof which is more broadly described above and in the appended claims.

EXAMPLES 1–8

Preparation of Coating Compositions

An aqueous solution of gelatin binder is prepared in a 100 ml. beaker by adding gelatin to water with vigorous stirring at a temperature of about 30° C. in a hot water bath. The gelatin is allowed to swell over a 45 minute period during constant stirring.

A solution of lead nitrate in distilled water and N-dodecyl-2-pyrrolidone is prepared in a separate 100 ml. glass beaker by heating an aqueous mixture of the lead salt to a temperature of about 30° C. in a hot water bath and stirring until all of the salt solids are dissolved, after which the N-dodecylpyrrolidone is added and stirring continued.

An aliquot is taken from the lead nitrate solution by pipet and is added to the stirred gelatin over a period of about 15 minutes. The resulting mixture is stirred at 45° C. for an additional 15 minutes after which the beaker containing the resulting dispersion is removed from the water bath and the dispersion is rapidly solidified by refrigeration at 5° C.

The following Table I reports the amounts of components employed in the preparation of the present coating compositions.

TABLE I

| Example | gelatin solution (g.)/mlH$_2$O | lactam (drops) | Pb(NO$_3$)$_2$ aliquot soln. g/mlH$_2$O | (ml) |
|---|---|---|---|---|
| 1 | 9/47 | 6 | 20/40 | 16 |
| 2 | 9/63 | 2 | 8/20 | 16 |
| 3 | 3/55 | 2 | 4/6 | 16 |
| 4 | 3/47 | 2 | 4/8 | 8 |
| 5 | 6/47 | 3 | 6/12 | 12 |
| 6 | 9/47 | 2 | 8/16 | 16 |
| 7 | 3/47 | 4 | 4/8 | 8 |
| 8 | 6/47 | 5 | 6/12 | 12 |

EXAMPLES 9–13

Each of the above coating compositions was melted at 50° C. and was coated over a ½ portion of the emulsion surface of a polyacetylene film comprising from about 3 to 37 micrometer thick layer of pentacosadiynoic acid microcrystals fixed in a gelatin binder at from about 12 to about 27% solids concentration. The coating operation was effected at a speed of 2.6 cm/ft$^2$ at about 47° C. and a die thickness setting of 0.01–0.02 inches.

The coated film was allowed to set for about 5 minutes and was air dried until the coating was clear and non-tacky to the touch. Coating thicknesses were measured by a Mikrokator thickness gauge.

The coated films were then imaged for 30 minutes with a Philips X-ray source at 16,200 Rad/minute and the results of coated and non-coated portions of the polyacetylene film compared. The results of these tests are reported in following Table II.

TABLE II

| Example | Coating Composition of Example # | % Solids | Thickness of Coat Micrometer | Visual Density Response Coated | Visual Density Response Uncoated |
|---|---|---|---|---|---|
| 9 | 4 | 18 | 3.18 | 0.81 | .05 |
| 10 | 5 | 20 | 17.82 | 0.56 | .05 |
| 11 | 6 | 27 | 37.3 | 0.34 | .05 |
| 12 | 7 | 12.7 | 5.0 | 0.86 | .05 |
| 13 | 8 | 20 | 22.82 | 0.65 | .05 |

The above examples illustrate the preferred embodiments of the invention; however, it is to be understood that other metal salts, e.g. lead or bismuth acetate, persulfate, perchlorate can be substituted in the above examples to provide the benefits of this invention. Also, other binders in the present compositions and other polyacetylene crystals in the imageable film layer, e.g. dicosa-10,12-diyne-1,22-dioic acid, 12,15-octacosadiyne, etc. can be substituted to provide the present advantages.

What is claimed is:

1. The process which comprises overcoating as a discrete overcoat layer the surface of an imageable polyacetylenic layer disposed on an irradiation imageable film with an effective sensitizing amount of the composition comprising between about 0.001% and about 1.0% by weight of an N-alkyl lactam dispersing aid and a metal nitrate, acetate or persulfate salt of a metal having an atomic number of at least 50 or a mixture of said metal salts dispersed in between about 4% and about 50% by weight of an aqueous solution of a binder compatible with the binder of imageable polyacetylene crystals; said composition having a weight ratio of metal salt to binder between about 0.4:1 and about 2.5:1.

2. The process of claim 1 wherein said composition is coated over the polyacetylenic layer in a thickness of between about 0.25 and about 500 micrometers.

3. The process of claim 2 wherein said composition is coated over the polyacetylenic layer in a thickness of between about 2 and about 40 micrometers.

4. The process of claim 3 wherein said polyacetylenic layer is a layer of pentacosadiynoic acid microcrystals fixedly positioned in a binder.

5. The process of claim 1 wherein the metal salt is lead nitrate.

6. The process of claim 1 wherein the N-alkyl lactam is N-dodecyl pyrrolidone.

7. The process of claim 1 wherein said overcoating is effected at a temperature of between about 20° C. and about 70° C.

8. The process of claim 1 wherein said overcoating is effected at a temperature of between about 35° C. and about 65° C.

9. A radiation imageable film comprising a layer of polyacetylenic microcrystals fixed in a binder overcoated with a discrete surface layer of the dried dispersion comprising between about 0.001% and about 1.0% by weight of an N-alkyl lactam dispersing aid and a metal nitrate, acetate or persulfate salt of a metal having an atomic number of at least 50 or a mixture of said metal salts dispersed in between about 4% and about 50% by weight of an aqueous solution of a binder compatible with the binder of imageable polyacetylene crystals; said composition having a weight ratio of metal salt to binder between about 0.4:1 and about 2.5:1.

10. The radiation imageable film of claim 9 wherein said composition contains from about 0.5% to about 1% by weight of N-alkyl lactam, from about 1% to about 75% by weight metal salt and from about 4% to about 15% by weight of binder and wherein the total solids of said composition is between about 1% and about 60% by weight.

11. The radiation imageable film of claim 9 wherein the weight ratio of metal salt to binder is between about 0.8:1 and about 1.5:1, the weight ratio of lactam to metal salt is between about 1:200 and about 1:10 and the total solids of the composition is between about 5% and about 30% by weight.

12. The radiation imageable film of claim 11 wherein said composition contains from about 0.5% to about 1% by weight N-dodecyl pyrrolidone, from about 20% to about 55% by weight of lead nitrate and from about 4% to about 15% by weight gelatin in aqueous solution, said composition having a total solids concentration of between about 5% and about 30% by weight.

13. The process of claim 1 wherein said salt of said composition is a lead, bismuth or thallium salt or a mixture thereof and the N-alkyl lactam is N-alkyl pyrrolidone wherein the alkyl group contains from 10 to 22 carbon atoms.

14. The process of claim 12 wherein the alkyl group of said N-alkyl pyrrolidone contains from 10 to 14 carbon atoms.

15. The process of claim 12 wherein said salt contains lead nitrate.

16. The process of claim 1 wherein said composition contains from about 0.5% to about 1% by weight of N-alkyl lactam, from about 1% to about 75% by weight metal salt and from about 4% to about 15% by weight of binder and wherein the total solids of said composition is between about 1% and about 60% by weight.

17. The process of claim 16 wherein weight ratio of metal salt to binder is between about 0.8:1 and about 1.5:1, the weight ratio of lactam to metal salt is between about 1:200 and about 1:10 and the total solids of the composition is between about 5% and about 30% by weight.

* * * * *